(12) United States Patent
Fuchigami

(10) Patent No.: US 8,183,637 B2
(45) Date of Patent: May 22, 2012

(54) SEMICONDUCTOR DEVICE

(75) Inventor: Chikashi Fuchigami, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 222 days.

(21) Appl. No.: 12/693,562

(22) Filed: Jan. 26, 2010

(65) Prior Publication Data

US 2010/0200921 A1   Aug. 12, 2010

(30) Foreign Application Priority Data

Feb. 6, 2009   (JP) .................................. 2009-026369

(51) Int. Cl.
*H01L 29/10* (2006.01)
*H01L 29/417* (2006.01)
(52) U.S. Cl. .............................. 257/358; 257/E27.062
(58) Field of Classification Search ........................ None
See application file for complete search history.

(56) References Cited

U.S. PATENT DOCUMENTS

| | | | | |
|---|---|---|---|---|
| 5,432,371 A | * | 7/1995 | Denner et al. | 257/409 |
| 5,631,793 A | * | 5/1997 | Ker et al. | 361/56 |
| 5,686,751 A | * | 11/1997 | Wu | 257/356 |
| 6,392,860 B1 | * | 5/2002 | Lin et al. | 361/111 |
| 6,696,708 B2 | * | 2/2004 | Hou et al. | 257/173 |
| 7,719,813 B2 | * | 5/2010 | Chen | 361/111 |
| 2003/0174452 A1 | * | 9/2003 | Chen et al. | 361/56 |

FOREIGN PATENT DOCUMENTS

| | | |
|---|---|---|
| EP | 948051 A2 * | 10/1999 |
| JP | 2005-260039 | 9/2005 |

* cited by examiner

*Primary Examiner* — Thomas L Dickey
*Assistant Examiner* — Joseph Schoenholtz
(74) *Attorney, Agent, or Firm* — Taft Stettinius & Hollister LLP

(57) ABSTRACT

There is provided a semiconductor device including: a field effect transistor that is provided with a gate region, a drain region and a source region and that is formed on a substrate; a circuit region that is formed on the substrate so as to be electrically isolated from the field effect transistor; a first guard ring that is formed in a ring shape encircling the field effect transistor and that includes an internal resistance; and a second guard ring that is formed in a ring shape encircling the circuit region, that forms a capacitance between the second guard ring and the gate region by capacitive coupling with the gate region, and that includes an internal resistance.

7 Claims, 10 Drawing Sheets

SEMICONDUCTOR DEVICE

CROSS-REFERENCE TO RELATED APPLICATIONS

This application is based on and claims priority under 35 U.S.C. §119 from Japanese Patent Application No. 2009-026369 filed on Feb. 6, 2009, the disclosure of which is incorporated by reference herein.

RELATED ART

1. Field of the Invention

The present disclosure relates to a semiconductor device, and more particularly relates to a semiconductor device that is provided with an electrostatic discharge protection circuit to be used for suppressing damage by electrostatic discharges to field effect transistors inside an integrated circuit.

2. Brief Discussion of Related Art

In a related art electrostatic discharge protection circuit for a semiconductor device, in order to prevent damage to n-channel MIS transistors from surge voltages caused by electrostatic discharges: a gate electrode and source electrode of a p-channel MIS transistor and a gate electrode of a first n-channel MIS transistor are connected to a power supply; the drain electrode of the first n-channel MIS transistor is connected to a terminal pad and to the drain electrode of the p-channel MIS transistor; the source electrode of the first n-channel MIS transistor and a drain electrode of a second n-channel MIS transistor are connected; a capacitance is connected between the terminal pad and the gate electrode of the second n-channel MIS transistor; a resistance is connected between the gate electrode of the second n-channel MIS transistor and ground; and a voltage higher than the threshold voltages of the first n-channel MIS transistor and the second n-channel MIS transistor is applied and a breakdown voltage is lowered (Japanese Patent Application Laid-Open (JP-A) No. 2005-260039).

However, with the electrostatic discharge protection circuit recited in JP-A No. 2005-260039, during usual operations and when an input signal rapidly changes, the second n-channel MIS transistor goes into a conductive state and operates incorrectly.

INTRODUCTION TO THE INVENTION

The present disclosure has been made in order to solve the problem described above, and an object is to provide a semiconductor device that both prevents a field effect transistor going into a conductive state at a time of usual operation, by capacitive coupling between a guard ring and the gate region of the field effect transistor, and prevents damage by surge voltages, by the field effect transistor being put into the conductive state when a surge voltage is applied.

The first aspect of the present disclosure provides a semiconductor device including:

a field effect transistor that is provided with a gate region, a drain region and a source region and that is formed on a substrate;

a circuit region that is formed on the substrate so as to be electrically isolated from the field effect transistor;

a first guard ring that is formed in a ring shape encircling the field effect transistor and that includes an internal resistance; and a second guard ring that is formed in a ring shape encircling the circuit region, that forms a capacitance between the second guard ring and the gate region by capacitive coupling with the gate region, and that includes an internal resistance.

According to the first aspect of the present disclosure, because of capacitive coupling between the gate region of the field effect transistor and the second guard ring formed in the ring shape to encircle the circuit region, a voltage is applied to the gate region of the field effect transistor via the capacitance. Therefore, mis-operation of the field effect transistor may be prevented.

The second aspect of the present disclosure provides the semiconductor device according to the first aspect, wherein the capacitance is formed between the field effect transistor and the circuit region.

According to the second aspect of the present disclosure, wiring that connects between the gate region of the field effect transistor and the circuit region is short. Therefore, signals may be propagated more quickly.

The third aspect of the present disclosure provides the semiconductor device according to the first aspect, wherein the field effect transistor is formed such that the gate region opposes the circuit region, and the capacitance is formed between a portion of the second guard ring that opposes the gate region and the gate region.

The fourth aspect of the present disclosure provides the semiconductor device according to the first aspect, wherein the field effect transistor is an n-type MOSFET, the first guard ring is p-type, the second guard ring is n-type, and the circuit region is a p-type MOSFET.

The fifth aspect of the present disclosure provides the semiconductor device according to the fourth aspect, wherein the gate region of the n-type MOSFET and a drain region of the p-type MOSFET are formed so as to oppose one another, and the capacitance is formed between a portion of the second guard ring that opposes the drain region of the p-type MOSFET and the gate.

According to the third to fifth aspects of the present disclosure, the gate region of the n-type MOSFET and the drain region of the p-type MOSFET are formed to oppose one another, and the capacitance is formed between the portion of the n-type guard ring that opposes the drain region of the p-type MOSFET and the gate region of the n-type MOSFET. Therefore, a voltage to be applied to the gate region of the n-type MOSFET may be more efficiently raised.

The sixth aspect of the present disclosure provides the semiconductor device according to the fourth aspect, wherein the gate region of the n-type MOSFET and a drain region of the p-type MOSFET are formed so as to oppose one another, and the capacitance is formed only between a portion of the second guard ring at a side thereof at which the n-type MOSFET is disposed and the gate.

According to the sixth aspect of the present disclosure, the capacitance is formed only between the n-type MOSFET side of the n-type guard ring and the gate region of the n-type MOSFET. Therefore, wiring between the gate region of the n-type MOSFET and ground may be prevented from crossing other wiring.

The seventh aspect of the present disclosure provides the semiconductor device according to the first aspect, wherein the gate region is connected to ground via a resistance.

The eighth aspect of the present disclosure provides the semiconductor device according to the seventh aspect, wherein the resistance comprises at least one of an internal resistance of a resistance region that is connected to ground and is formed so as to be electrically isolated from the first guard ring and an internal resistance of the first guard ring.

The ninth aspect of the present disclosure provides the semiconductor device according to the seventh aspect, wherein the capacitance is connected to the gate region and the gate region is connected to the resistance.

According to the seventh to ninth aspects of the present disclosure, the gate region of the n-type MOSFET is connected to ground via the resistance. Therefore, operations of the n-type MOSFET may be kept stable.

According to the present disclosure as described hereabove, mis-operation of the field effect transistor and damage to the field effect transistor may be prevented by capacitive coupling between the gate region of the field effect transistor and the guard ring formed in the ring shape at the periphery of the circuit region.

BRIEF DESCRIPTION OF THE DRAWINGS

Exemplary embodiments of the present disclosure will be described in detail based on the following figures, wherein.

DETAILED DESCRIPTION

Figure 1:
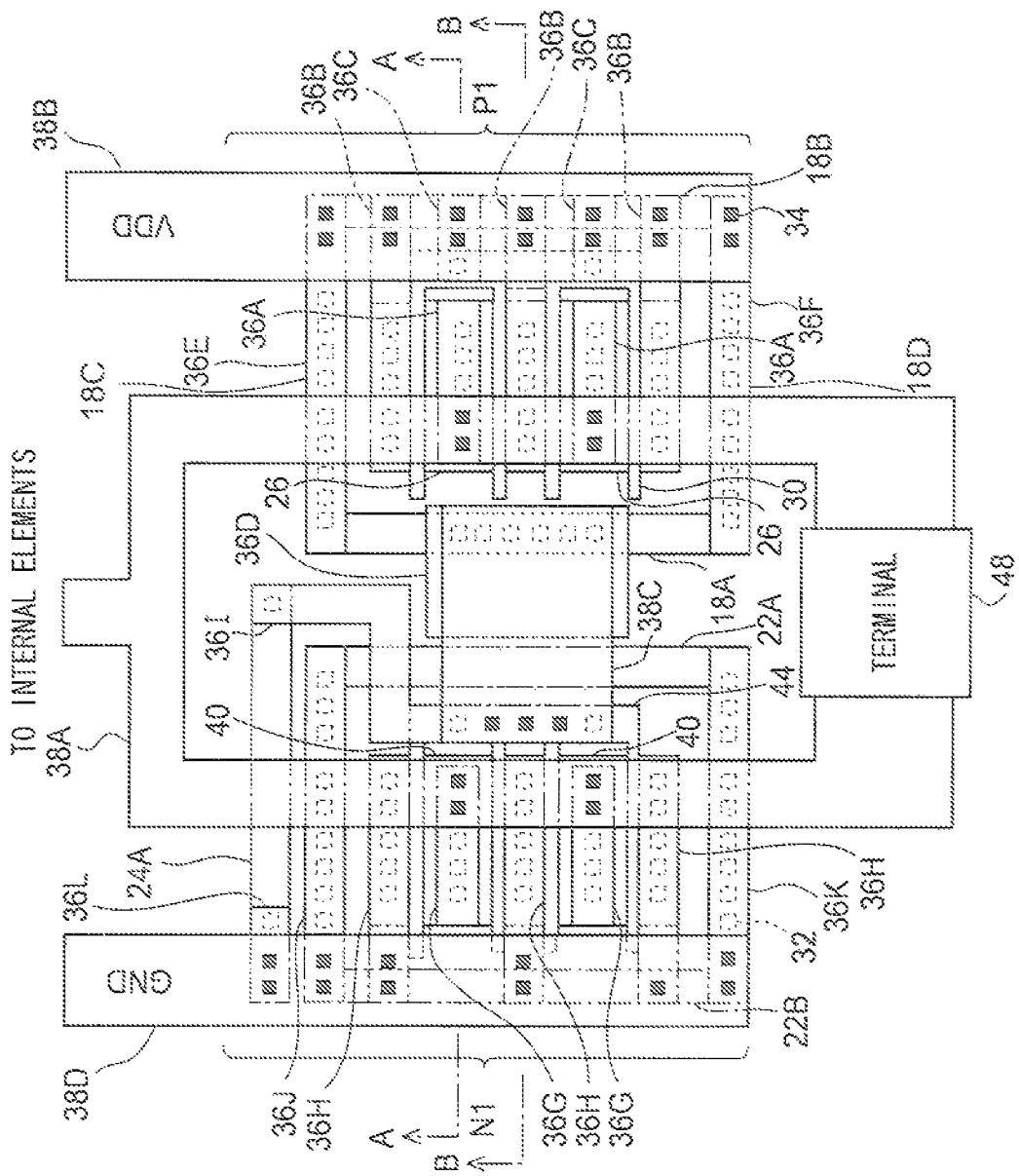
FIG. 1 is a plan view of a semiconductor device relating to a first exemplary embodiment.
Figure 2:
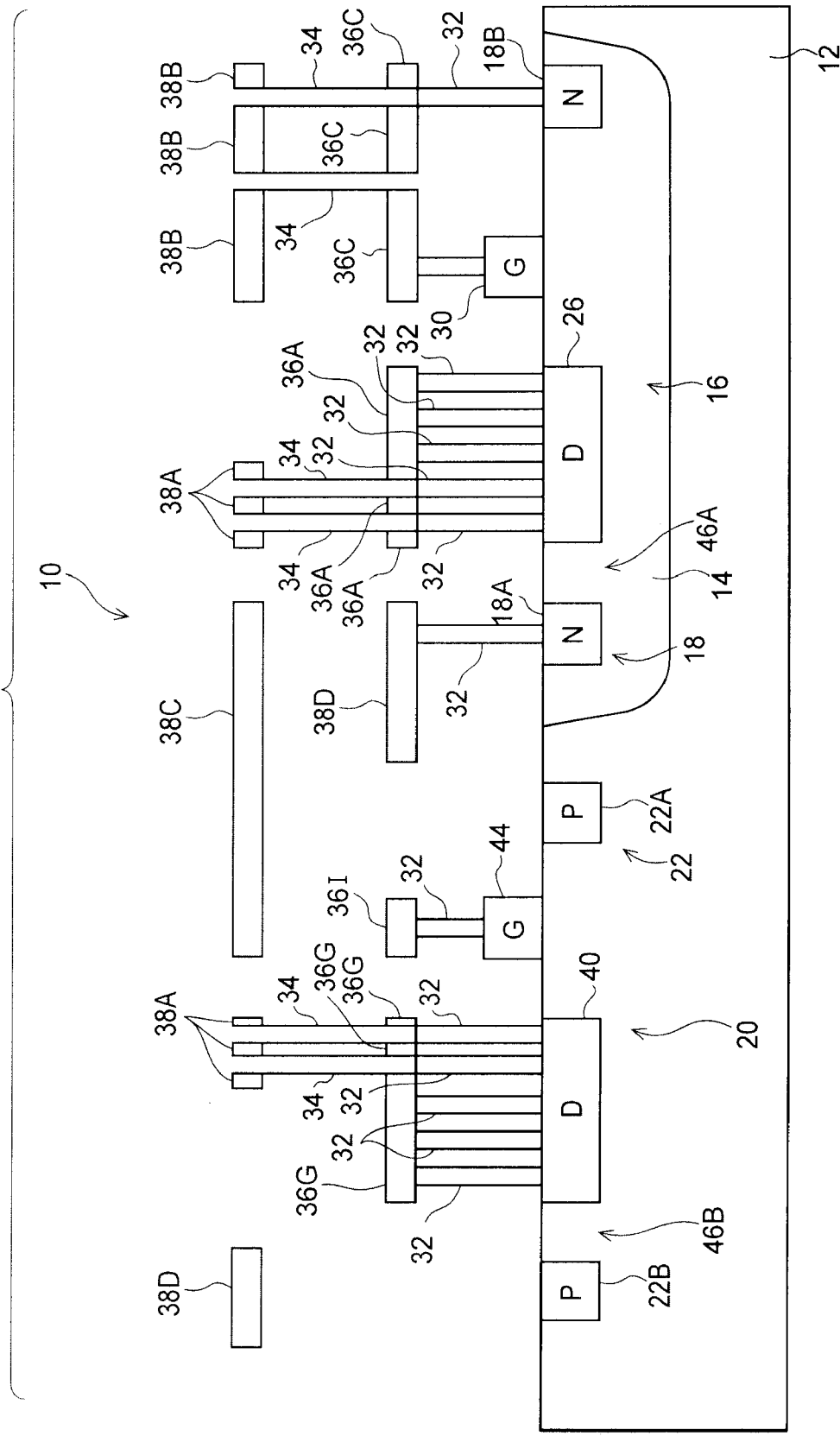
FIG. 2 is a sectional view of the semiconductor device relating to the first exemplary embodiment, taken along A-A.
Figure 3:
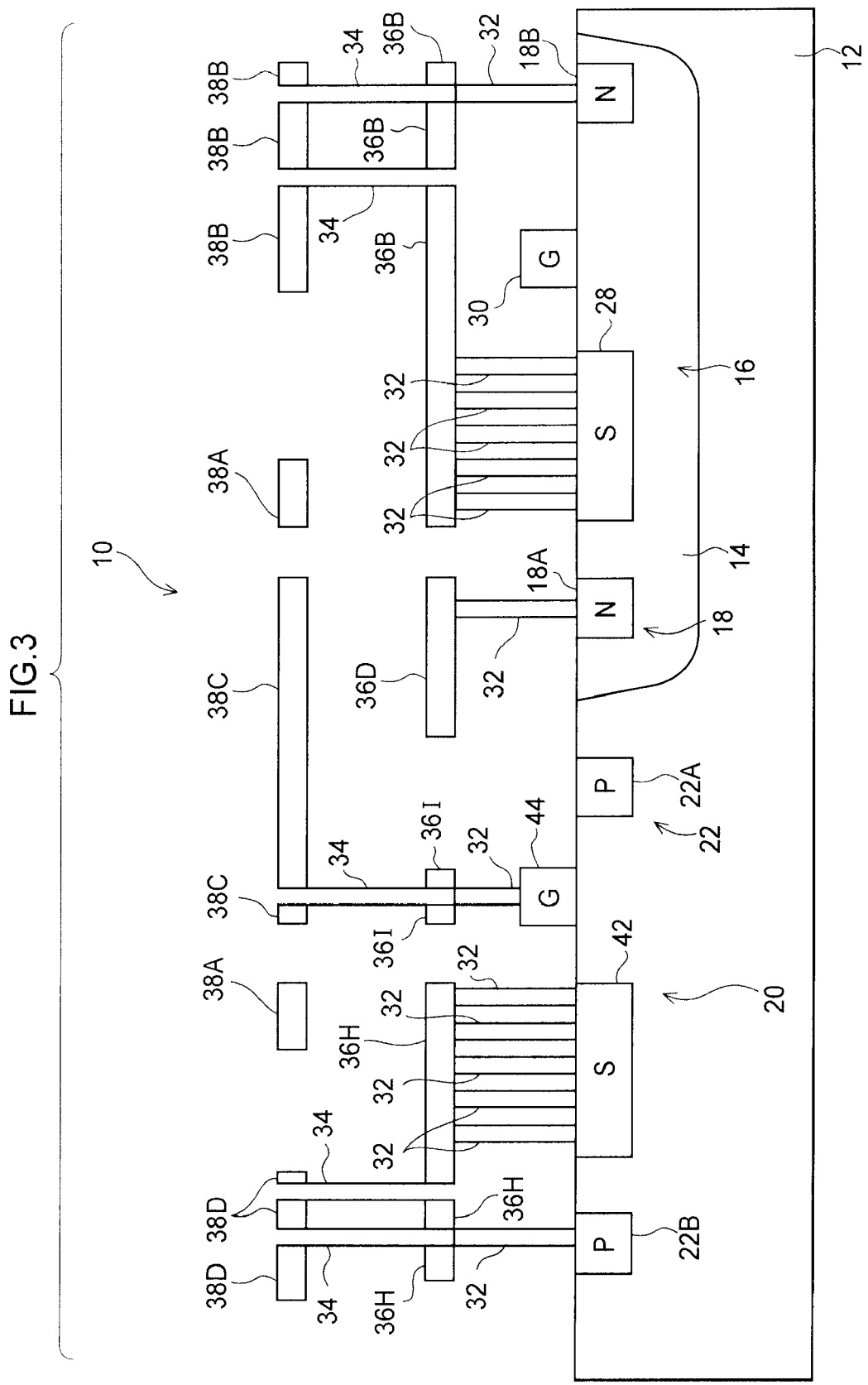
FIG. 3 is a sectional view of the semiconductor device relating to the first exemplary embodiment, taken along B-B.

The exemplary embodiments of the present disclosure are described and illustrated below to encompass a semiconductor device and, more particularly, a semiconductor device that is provided with an electrostatic discharge protection circuit to be used for suppressing damage by electrostatic discharges to field effect transistors inside an integrated circuit. Of course, it will be apparent to those of ordinary skill in the art that the preferred embodiments discussed below are exemplary in nature and may be reconfigured without departing from the scope and spirit of the present invention. However, for clarity and precision, the exemplary embodiments as discussed below may include optional steps, methods, and features that one of ordinary skill should recognize as not being a requisite to fall within the scope of the present invention.

As illustrated in FIG. 1 to FIG. 4, an electrostatic discharge protection circuit 10 relating to a first exemplary embodiment is structured with two field effect transistors formed on a substrate, and a first insulation layer, a first wiring metal layer, a second insulation layer and a second wiring metal layer laminated on the field effect transistors.

Described more specifically, the electrostatic discharge protection circuit 10 is structured with an n-type n-well 14, which is formed at a partial region of a p-type substrate 12, a p-channel field effect transistor 16 (hereinafter referred to as a p-MOSFET), an n-type guard ring 18, an n-MOSFET 20, a p-type guard ring 22 and an internal resistance 24A. The p-MOSFET 16 is formed on the n-well 14. The n-type guard ring 18 is formed around the p-MOSFET 16, includes an internal resistance 50 and has a higher concentration of impurities than the n-well 14. The n-MOSFET 20 is formed so as to be electrically isolated from the p-MOSFET 16 on the p-type substrate 12. The p-type guard ring 22 is formed in a rectangular ring shape so as to encircle the n-MOSFET 20, includes an internal resistance, and has a higher concentration of impurities than the p-type substrate 12. The internal resistance 24A is provided at a region on the p-type substrate 12 in the vicinity of the p-type guard ring 22.

That is, because the impurities are included, the n-type guard ring 18 has a resistive component, and this resistive component serves as the internal resistance 50 of the n-type guard ring 18. The p-type guard ring 22 also has a resistive component because impurities are included, and this resistive component serves as the internal resistance of the p-type guard ring 22.

The p-MOSFET 16 is provided with a drain region (D) 26, a source region (S) 28 and a gate region (G) 30.

The drain region 26 of the p-MOSFET 16 is connected, via plural contact metals 32 that are provided extending in the thickness direction of the first insulation layer formed on the p-type substrate, with a first wiring metal 36A of the first wiring metal layer that is formed on the first insulation layer. The drain region 26 is also connected, via a plural number of the contact metals 32 and a plural number of vias 34, with a second wiring metal 38A, which is connected with both a terminal pad 48 and internal elements 49, which are formed on the first wiring metal 36A. The vias 34 are formed in the second insulation layer on the first wiring metal 36A so as to connect between the first wiring metal 36A and the second wiring metal 38A. The source region 28 is connected, via a number of the contact metals 32, with a first wiring metal 36B provided in the first wiring metal layer, and the gate region 30 is connected, via a number of the contact metals 32, with a first wiring metal 36C provided in the first wiring metal layer.

A first portion 18A at the n-MOSFET 20 side of the n-type guard ring 18 is connected, via a number of the contact metals 32, with a first wiring metal 36D provided in the first wiring metal layer.

A second portion 18B of the n-type guard ring, which is opposite from the first portion 18A, is connected, via a number of the contact metals 32, with the first wiring metal 36B and first wiring metal 36C provided in the first wiring metal layer. The second portion 18B of the n-type guard ring is also connected, via a number of the contact metals 32 and a number of the vias 34, with a second wiring metal 38B, which is provided in the second wiring metal layer and is connected with a power supply.

A third portion 18C of the n-type guard ring 18, which opposes the source region 28 of the p-MOSFET 16, is connected, via a number of the contact metals 32, with a first wiring metal 36E provided in the first wiring metal layer. The third portion 18C of the n-type guard ring is also connected, via a number of the contact metals 32 and a number of the vias 34, with the second wiring metal 38B provided in the second wiring metal layer.

A fourth portion 18D of the n-type guard ring, which is opposite from the third portion 18C of the n-type guard ring, is connected, via a number of the contact metals 32, with a first wiring metal 36F provided in the first wiring metal layer. The fourth portion 18D of the n-type guard ring is also connected, via a number of the contact metals 32 and a number of the vias 34, with the second wiring metal 38B provided in the second wiring metal layer.

The n-MOSFET 20 is provided with a drain region (D) 40, a source region (S) 42 and a gate region (G) 44.

The drain region 40 of the n-MOSFET 20 is connected, via a number of the contact metals 32, with a first wiring metal 36G provided in the first wiring metal layer. The drain region 40 is also connected, via a number of the contact metals 32 and a number of the vias 34, with the second wiring metal 38A provided in the second wiring metal layer. The source region 42 is connected, via a number of the contact metals 32, with a first wiring metal 36H provided in the first wiring metal layer. The gate region 44 of the n-MOSFET 20 is connected, via a number of the contact metals 32, with a first wiring metal 36I provided in the first wiring metal layer. The gate region 44 is also connected, via a number of the contact metals 32 and a number of the vias 34, with a second wiring metal 38C provided in the second wiring metal layer.

A second portion 22B of the p-type guard ring 22, which is opposite from a first portion 22A thereof at the n-MOSFET 20 side, is connected, via a number of the contact metals 32, with the first wiring metal 36H provided in the first wiring metal layer. The second portion 22B of the p-type guard ring 22 is connected, via a number of the contact metals 32 and a number of the vias 34, with a second wiring metal 38D, which is provided in the second wiring metal layer and is connected to ground.

A third portion 22C of the p-type guard ring 22, which opposes the source region 42 of the n-MOSFET 20, is connected, via a number of the contact metals 32, with the first wiring metal 36J provided in the first wiring metal layer. The third portion 22C of the p-type guard ring 22 is also connected, via a number of the contact metals 32 and a number of the vias 34, with the second wiring metal 38D provided in the second wiring metal layer.

A fourth portion 22D of the p-type guard ring, which is opposite from the third portion 22C of the p-type guard ring, is connected, via a number of the contact metals 32, with a first wiring metal 36K provided in the first wiring metal layer. The fourth portion 22D of the p-type guard ring 22 is also connected, via a number of the contact metals 32 and a number of the vias 34, with the second wiring metal 38D provided in the second wiring metal layer.

One end of a resistance region that includes the internal resistance 24A is connected with the first wiring metal 36I provided in the first wiring metal layer via the contact metals 32, and the other end is connected with a first wiring metal 36L provided in the first wiring metal layer via a number of the contact metals 32. The internal resistance 24A is also connected, via a number of the contact metals 32 and a number of the vias 34, with the second wiring metal 38D provided in the second wiring metal layer.

Herein, the second insulation layer is provided between the first wiring metal 36D provided in the first wiring metal layer and the second wiring metal 38C provided in the second wiring metal layer. Thus, the first portion 18A of the n-type guard ring and the gate region 44 of the n-MOSFET 20 are capacitively coupled such that a parasitic capacitance 45A is generated between the first wiring metal 36D and the second wiring metal 38C, as illustrated in FIG. 4.

Figure 4:
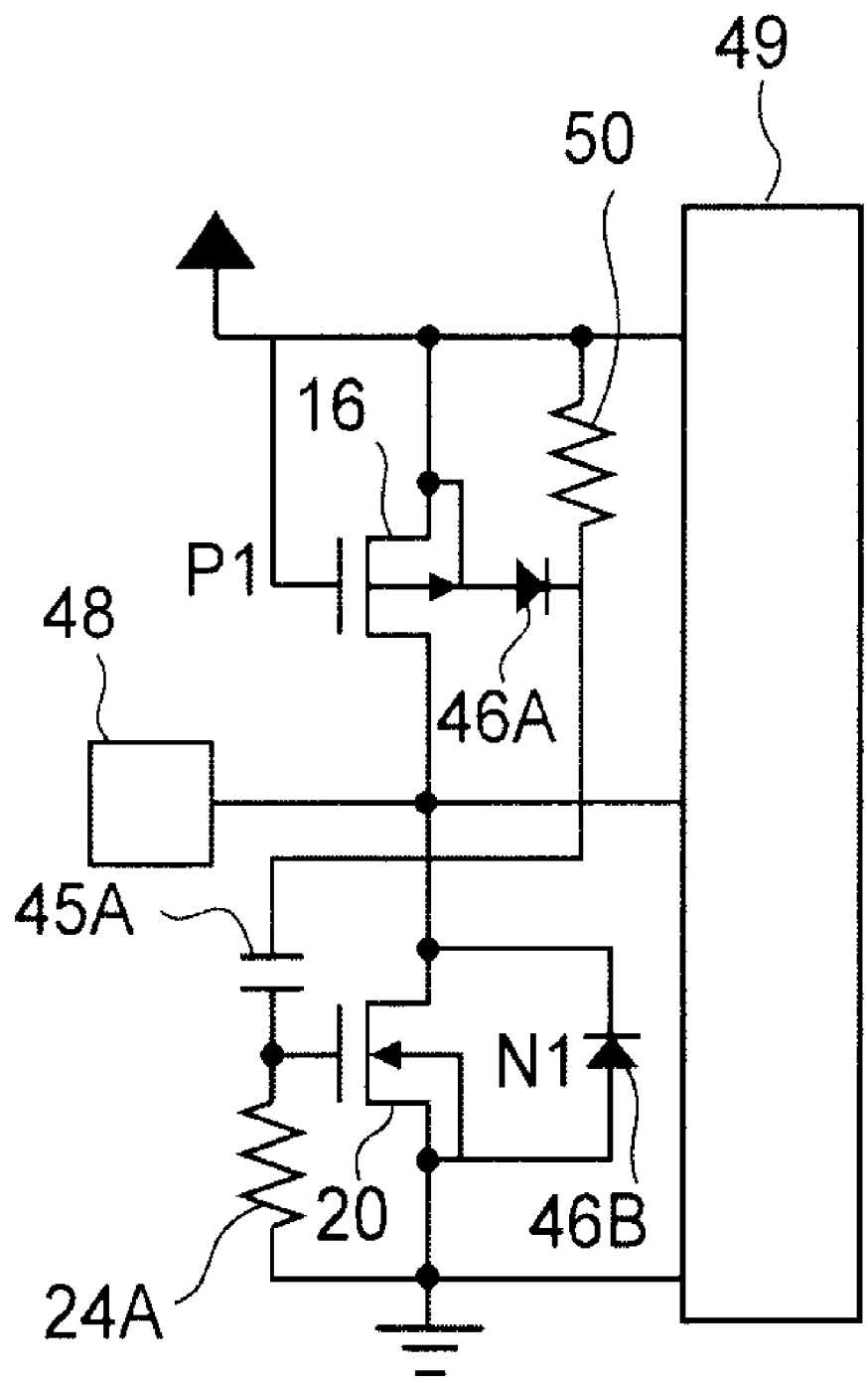
FIG. 4 is a circuit diagram of the semiconductor device relating to the first exemplary embodiment.

Further, because the drain region 26 of the p-MOSFET 16 is p-type and the first portion 18A of the n-type guard ring is n-type, a parasitic diode 46A illustrated in FIG. 4 is generated between the drain region 26 and the first portion 18A of the n-type guard ring. In addition, because the drain region 40 of the p-MOSFET 16 is n-type and the second portion 22B of the p-type guard ring is p-type, a parasitic diode 46B illustrated in FIG. 4 is generated between the drain region 40 and the second portion 22B of the p-type guard ring.

If the structure described above is represented by an equivalent circuit, as illustrated in FIG. 4, the source region 28 and gate region 30 of the p-MOSFET 16 are connected with the power supply and the drain region 26 is connected with the drain region 40 of the n-MOSFET 20, the terminal pad 48 and the internal elements 49.

The source region 42 of the n-MOSFET 20 is connected to ground. The gate region 44 is connected to ground through the internal resistance 24A, and is also connected to one end of the parasitic capacitance 45A.

The anode of the parasitic diode 46A is connected with the drain region 26 of the p-MOSFET 16, and the cathode is both connected with the power supply through the internal resistance 50 and connected with the other end of the parasitic capacitance 45A.

Next, operation of the electrostatic discharge protection circuit 10 relating to the present exemplary embodiment is described using the equivalent circuit of FIG. 4.

If a positive surge voltage is applied to the terminal pad 48, the parasitic diode 46A of the p-MOSFET 16 goes into the conductive state, and a surge current I1 flows through the parasitic capacitance 45A and the internal resistance 24A. The potential of the gate of the n-MOSFET 20 is raised by the surge current I1, and the n-MOSFET 20 goes into the conductive state.

When the n-MOSFET 20 goes into the conductive state, another surge current I2 flows through the drain region 40 and source region 42 of the n-MOSFET 20 to ground.

If a negative surge voltage is applied to the terminal pad 48, the parasitic diode 46B of the n-MOSFET 20 goes into the conductive state, and another surge current I3 flows from ground in the direction toward the terminal pad 48.

As described hereabove, in the electrostatic discharge protection circuit relating to the present exemplary embodiment, an n-type guard ring and the gate region of an n-MOSFET are capacitively coupled. Therefore, while parasitic diodes of a p-MOSFET and the n-MOSFET may be prevented from going into the conductive state at times of usual operation, the n-MOSFET is put into the conductive state if a positive surge voltage is applied, thus, the parasitic diode of the n-MOSFET may prevent damage by positive surge voltages.

Now, a second exemplary embodiment is described. Here, portions that correspond with the first exemplary embodiment are assigned the same reference numerals and are not described.

Figure 5:
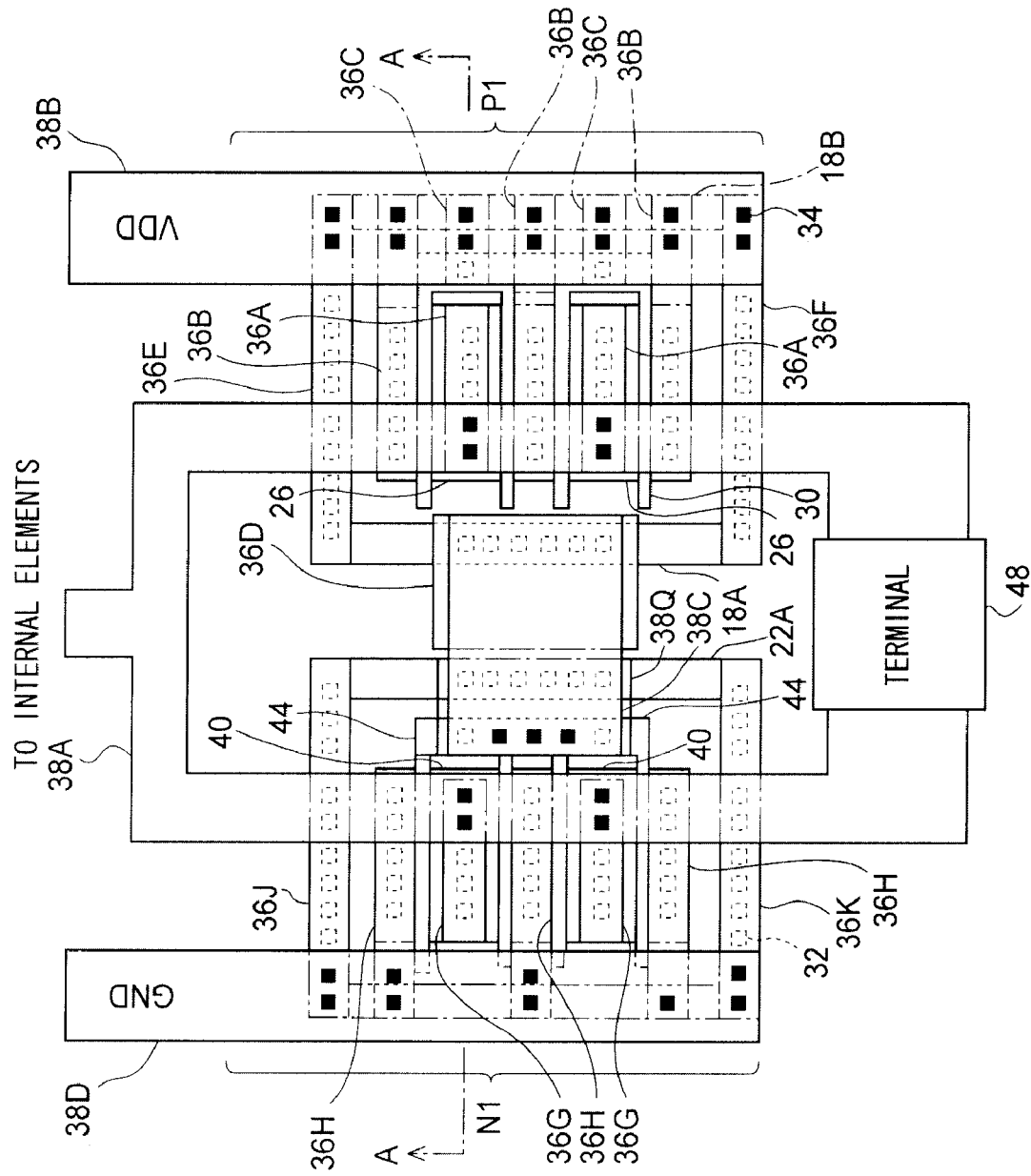
FIG. 5 is a plan view of a semiconductor device relating to a second exemplary embodiment.
Figure 6:
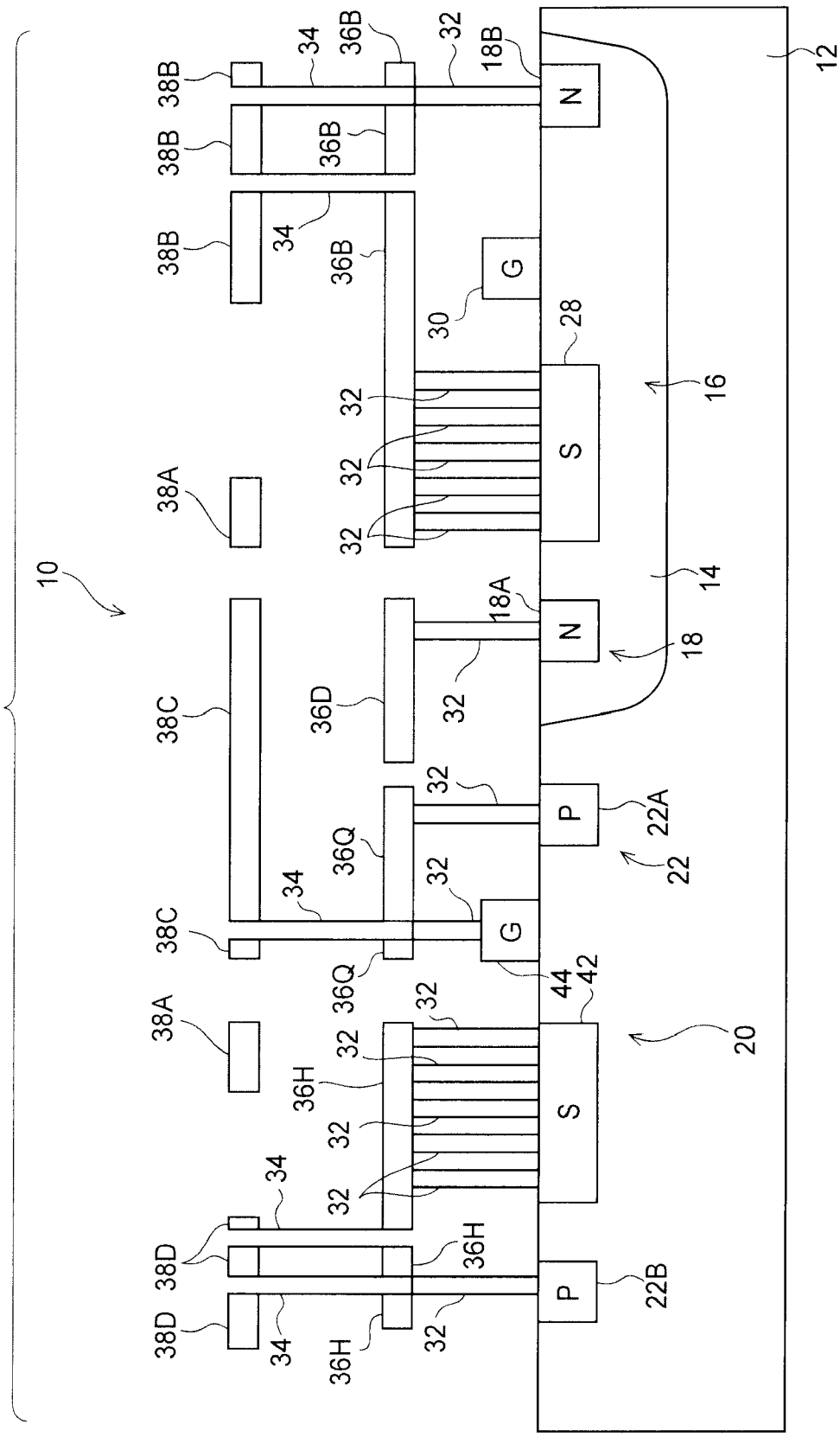
FIG. 6 is a sectional view of the semiconductor device relating to the second exemplary embodiment, taken along A-A.
Figure 7:
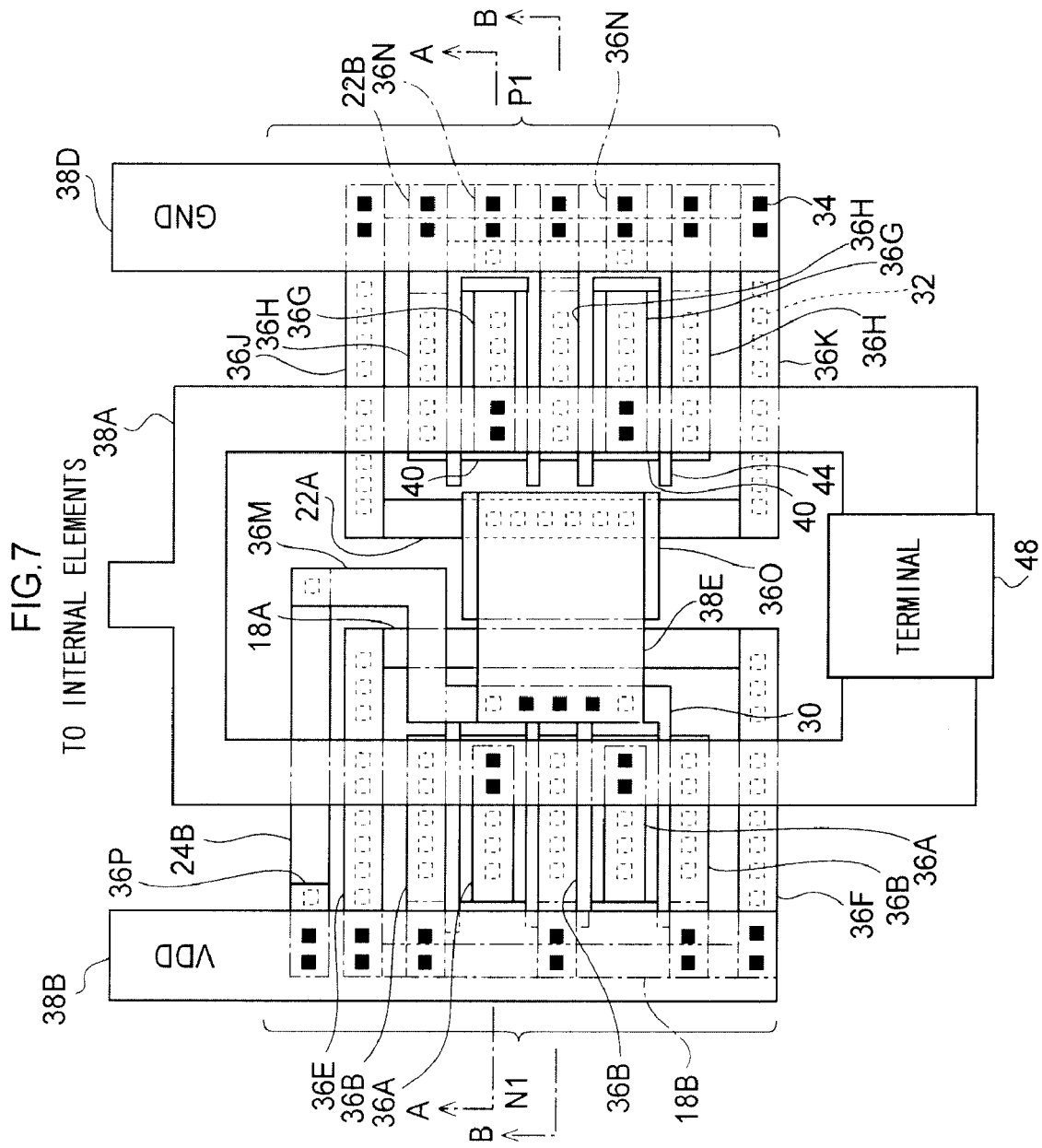
FIG. 7 is a circuit diagram of the semiconductor device relating to a third exemplary embodiment.
Figure 8:
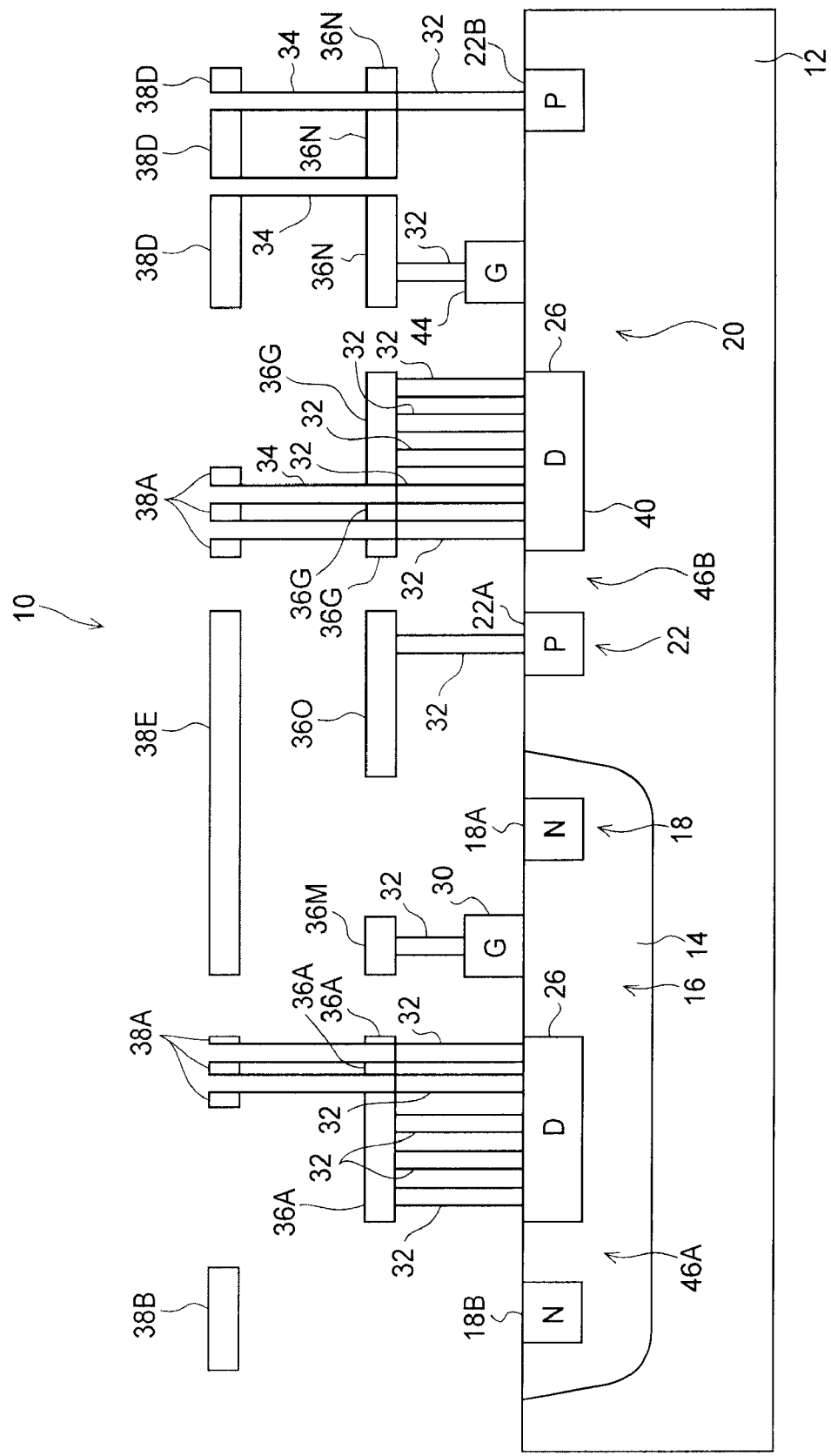
FIG. 8 is a sectional view of the semiconductor device relating to the third exemplary embodiment, taken along A-A.
Figure 9:
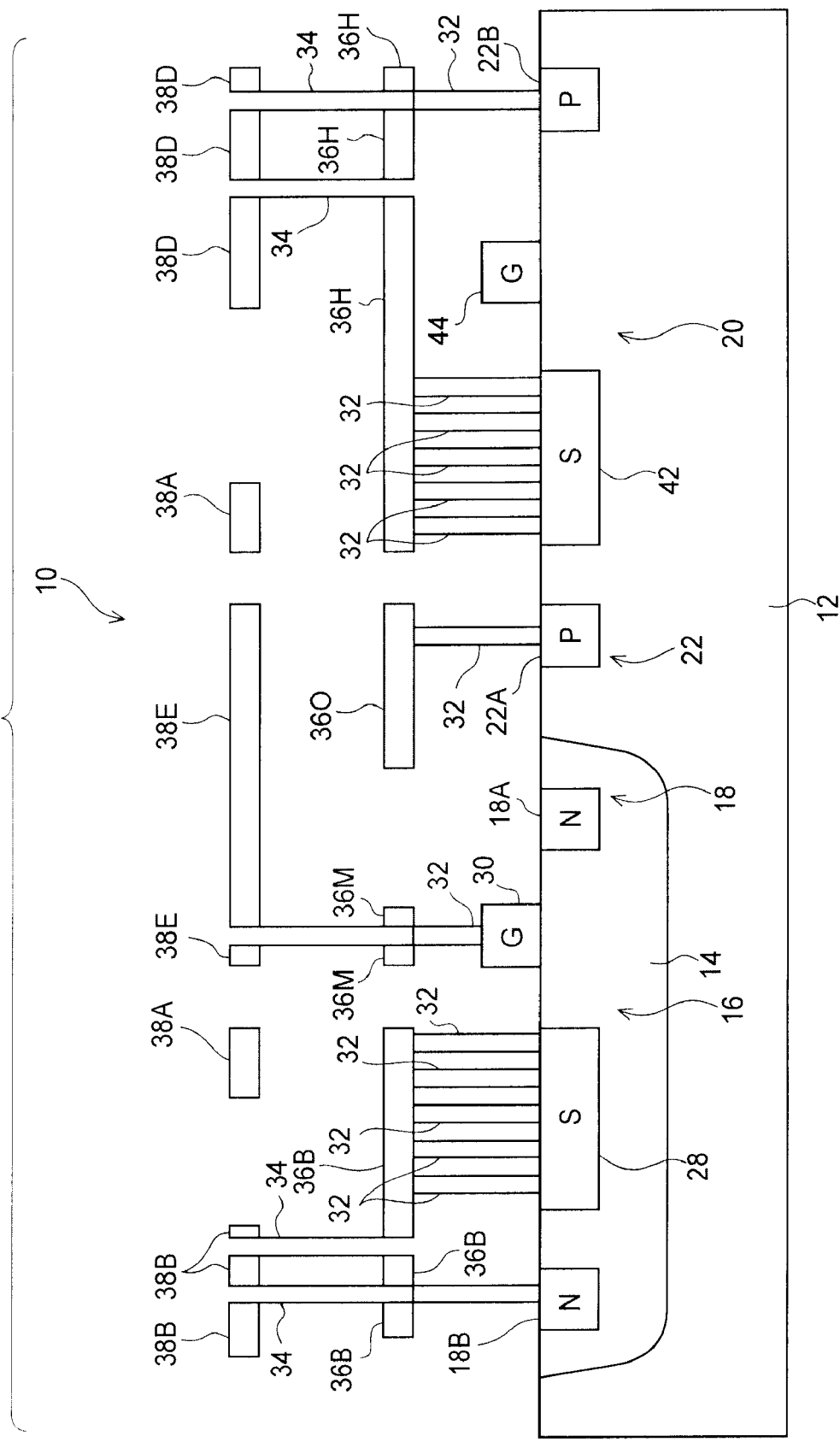
FIG. 9 is a sectional view of the semiconductor device relating to the third exemplary embodiment, taken along B-B.

As illustrated in FIG. 5 and FIG. 6, the electrostatic discharge protection circuit 10 relating to the present exemplary embodiment uses an internal resistance of the p-type guard ring 22 instead of the internal resistance 24A of the first exemplary embodiment, and the first portion 22A of the p-type guard ring and the gate region 44 of the n-MOSFET 20 are connected, via a number of the contact metals 32, with a first wiring metal 36Q provided in the first wiring metal layer.

Further, as illustrated in FIG. 6, viewing the gate region 44 of the n-MOSFET 20 from the second wiring metal layer side, the parasitic capacitance 45A, the gate region 44 and the internal resistance of the p-type guard ring 22 are connected in this order.

Operation of the electrostatic discharge protection circuit 10 of the present exemplary embodiment is similar to the first exemplary embodiment, so will not be described.

As described hereabove, in the electrostatic discharge protection circuit relating to the present exemplary embodiment, a parasitic capacitance, the gate region of an n-MOSFET and a p-type guard ring are connected in this order. Therefore, when a surge current flows into the p-type substrate via the drain region and source region of the n-MOSFET, a potential difference between the two ends of the p-type guard ring before this surge current flows to ground may be smaller than a potential difference between the two ends of the p-type guard ring after the surge current flows to ground. Therefore, charge on the parasitic capacitance is less likely to discharge, and the conductive state of the n-MOSFET may be maintained for longer.

Herein, a diode may be used instead of the p-MOSFET 16 in the above-described first exemplary embodiment and second exemplary embodiment, with the anode being connected to the power supply and the cathode being connected to the n-type guard ring.

If the diode is used instead of the p-MOSFET 16 in the above-described first exemplary embodiment and second exemplary embodiment, the cathode of the diode and the gate region 44 of the n-MOSFET 20 may be capacitively coupled.

Now, a third exemplary embodiment is described. Herein, portions that correspond with the first exemplary embodiment are assigned the same reference numerals and are not described.

As illustrated in FIG. 7 to FIG. 10, the electrostatic discharge protection circuit 10 relating to the present exemplary embodiment capacitively couples the gate region 30 of the p-MOSFET 16 with the p-type guard ring 22 instead of the capacitive coupling of the first exemplary embodiment between the n-type guard ring 18 and the gate region 44 of the n-MOSFET 20, and employs an internal resistance 24B instead of the internal resistance 24A.

The gate region 30 of the p-MOSFET 16 is connected, via a number of the contact metals 32, with a first wiring metal 36M provided in the first wiring metal layer. The gate region 30 is also connected, via a number of the contact metals 32 and a number of the vias 34, with a second wiring metal 38E provided in the second wiring metal layer.

The second portion 18B of the n-type guard ring is connected, via a number of the contact metals 32, with the first wiring metal 36B provided in the first wiring metal layer. The second portion 18B of the n-type guard ring is connected, via a number of the contact metals 32 and a number of the vias 34, with the second wiring metal 38B provided in the second wiring metal layer.

The gate region 44 of the n-MOSFET 20 is connected, via a number of the contact metals 32, with a first wiring metal 36N provided in the first wiring metal layer.

The first portion 22A of the p-type guard ring is connected, via a number of the contact metals 32, with a first wiring metal 36O provided in the first wiring metal layer.

The second portion 22B of the p-type guard ring is connected, via a number of the contact metals 32, with the first wiring metal 36H and first wiring metal 36N provided in the first wiring metal layer. The second portion 22B of the p-type guard ring is also connected, via a number of the contact metals 32 and plural vias, with the second wiring metal 38D provided in the second wiring metal layer.

One end of a resistance region that includes the internal resistance 24B, which is provided in a region on the p-type substrate 12 in a vicinity of the n-type guard ring 18, is connected via the contact metals 32 with the first wiring metal 36M provided in the first wiring metal layer, and the other end is connected with a first wiring metal 36P provided in the first wiring metal layer via a number of the contact metals 32. The internal resistance 24B is also connected, via a number of the contact metals 32 and a number of the vias 34, with the second wiring metal 38B provided in the second wiring metal layer.

Herein, the second insulation layer is provided between the first wiring metal 36O provided in the first wiring metal layer and the second wiring metal 38E provided in the second wiring metal layer. Thus, the gate region 30 of the p-MOSFET 16 and the first portion 22A of the p-type guard ring are capacitively coupled such that a parasitic capacitance 45B illustrated in FIG. 10 is generated between the first wiring metal 36O and the second wiring metal 38E.

Figure 10:
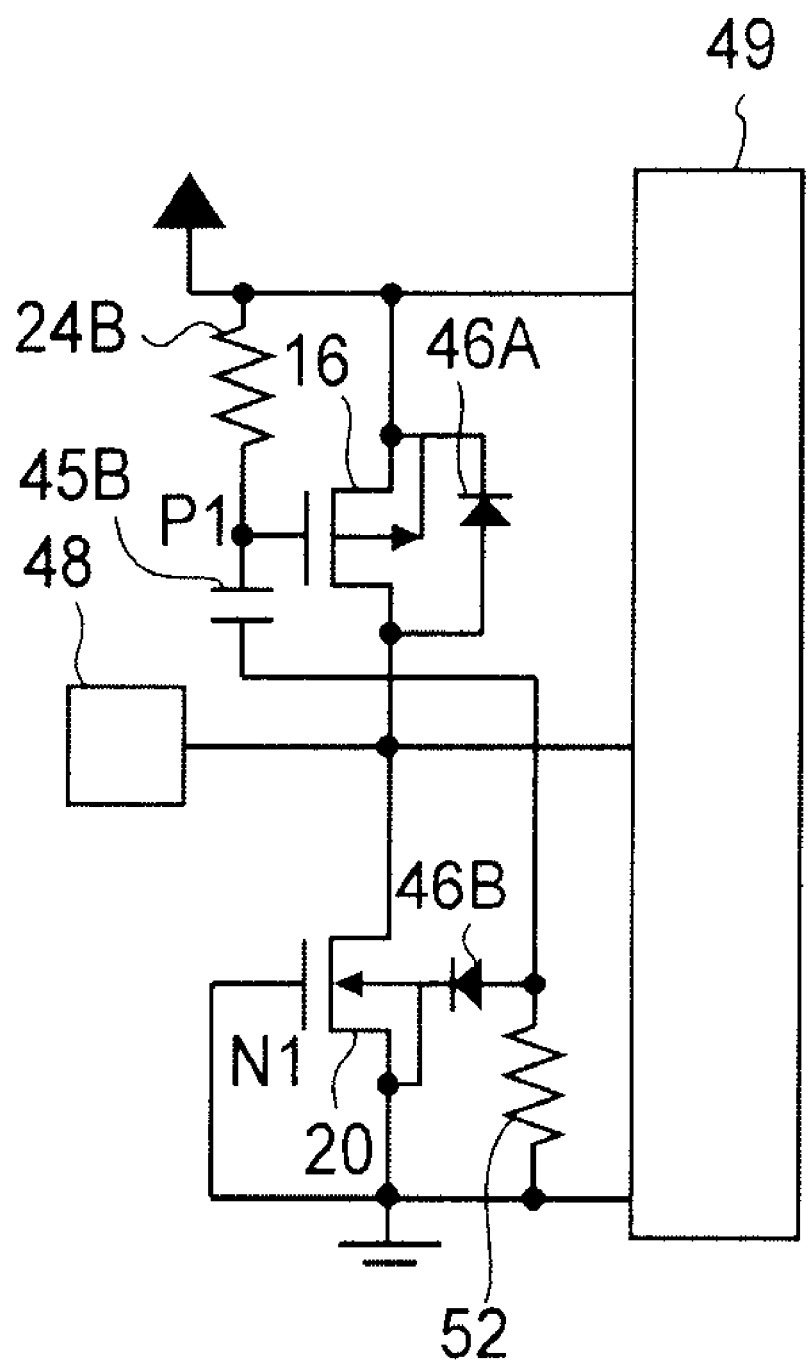
FIG. 10 is a circuit diagram of the semiconductor device relating to the third exemplary embodiment.

If the structure described above is represented by an equivalent circuit, as illustrated in FIG. 10, the source region 28 of the p-MOSFET 16 is connected with the power supply and the drain region 26 is connected with the drain region 40 of the n-MOSFET 20, the terminal pad 48 and the internal elements 49, and the gate region is both connected with the power supply via the internal resistance 24B and connected with one end of the parasitic capacitance 45B.

The source region 42 and gate region 44 of the n-MOSFET 20 are connected to ground.

The anode of the parasitic diode 46B is both connected with the other end of the parasitic capacitance 45B and connected to ground via an internal resistance 52 of the p-type guard ring 22, and the cathode is connected with the drain region 40 of the n-MOSFET 20.

Next, operation of the electrostatic discharge protection circuit 10 of the present exemplary embodiment is described using the equivalent circuit of FIG. 10.

If a positive surge voltage is applied to the terminal pad 48, the parasitic diode 46A of the p-MOSFET 16 goes into the conductive state, and a surge current I4 flows toward the power supply.

If a negative surge voltage is applied to the terminal pad 48, the parasitic diode 46B of the n-MOSFET 20 goes into the conductive state, and another surge current I5 flows through the resistance 24B and the parasitic capacitance 45B. The potential of the gate of the p-MOSFET 16 is lowered by the surge current I5, and the p-MOSFET 16 is put into the conductive state.

When the p-MOSFET 16 goes into the conductive state, another surge current I6 flows through the source region 28 and drain region 26 of the p-MOSFET 16 to the terminal pad 48.

As described hereabove, in the electrostatic discharge protection circuit relating to the present exemplary embodiment, the gate region of a p-MOSFET and a p-type guard ring are capacitively coupled. Therefore, the p-MOSFET goes into the conductive state if a negative surge voltage is applied, and the parasitic diode of the p-MOSFET may prevent damage by negative surge voltages.

In the present exemplary embodiment, the internal resistance 50 of the n-type guard ring 18 described in the second exemplary embodiment may be used instead of the internal resistance 24B.

Further in the present exemplary embodiment, a diode may be used instead of the n-MOSFET 20, with the anode being connected to the p-type guard ring and the cathode being connected to the terminal pad 48.

If the diode is used instead of the n-MOSFET 20 in the present exemplary embodiment, the anode of the diode and the gate region 30 of the p-MOSFET 16 may be capacitively coupled.

Following from the above description and disclosure summaries, it should be apparent to those of ordinary skill in the art that, while the methods and apparatuses herein described constitute exemplary embodiments of the present disclosure, the invention contained herein is not limited to this precise embodiment and that changes may be made to such embodiments without departing from the scope of the invention as defined by the claims. Additionally, it is to be understood that the invention is defined by the claims and it is not intended that any limitations or elements describing the exemplary embodiments set forth herein are to be incorporated into the interpretation of any claim element unless such limitation or element is explicitly stated. Likewise, it is to be understood that it is not necessary to meet any or all of the identified advantages or objects of the disclosure in order to fall within the scope of any claims, since the invention is defined by the claims and since inherent and/or unforeseen advantages of the present invention may exist even though they may not have been explicitly discussed herein.

What is claimed is:

1. A semiconductor device comprising:
   a field effect transistor that is provided with a gate region, a drain region and a source region and that is formed on a substrate;
   a circuit region that is formed on the substrate so as to be electrically isolated from the field effect transistor;
   a first guard ring that is formed in a ring shape encircling the field effect transistor and that includes an internal resistance; and
   a second guard ring that is formed in a ring shape encircling the circuit region, that forms a capacitance between the second guard ring and the gate region by capacitive coupling with the gate region, and that includes an internal resistance;
   wherein the field effect transistor is formed such that the gate region opposes the circuit region, and the capacitance is formed between a portion of the second guard ring that opposes the gate region and the gate region.

2. The semiconductor device according to claim 1, wherein the field effect transistor is an n-type MOSFET, the first guard ring is p-type, the second guard ring is n-type, and the circuit region is a p-type MOSFET.

3. A semiconductor device comprising:
   a field effect transistor that is provided with a gate region, a drain region and a source region and that is formed on a substrate;
   a circuit region that is formed on the substrate so as to be electrically isolated from the field effect transistor;
   a first guard ring that is formed in a ring shape encircling the field effect transistor and that includes an internal resistance; and
   a second guard ring that is formed in a ring shape encircling the circuit region, that forms a capacitance between the second guard ring and the gate region by capacitive coupling with the gate region, and that includes an internal resistance;
   wherein the field effect transistor is an n-type MOSFET, the first guard ring is p-type, the second guard ring is n-type, and the circuit region is a p-type MOSFET; and
   wherein the gate region of the n-type MOSFET and a drain region of the p-type MOSFET are formed so as to oppose one another, and the capacitance is formed between a portion of the second guard ring that opposes the drain region of the p-type MOSFET and the gate.

4. A semiconductor device comprising:
   a field effect transistor that is provided with a gate region, a drain region and a source region and that is formed on a substrate;
   a circuit region that is formed on the substrate so as to be electrically isolated from the field effect transistor;
   a first guard ring that is formed in a ring shape encircling the field effect transistor and that includes an internal resistance; and
   a second guard ring that is formed in a ring shape encircling the circuit region, that forms a capacitance between the second guard ring and the gate region by capacitive coupling with the gate region, and that includes an internal resistance;
   wherein the field effect transistor is an n-type MOSFET, the first guard ring is p-type, the second guard ring is n-type, and the circuit region is a p-type MOSFET; and,
   wherein the gate region of the n-type MOSFET and a drain region of the p-type MOSFET are formed so as to oppose one another, and the capacitance is formed only between a portion of the second guard ring at a side thereof at which the n-type MOSFET is disposed and the gate.

5. The semiconductor device according to claim 1, wherein the gate region is connected to ground via a resistance.

6. The semiconductor device according to claim 5, wherein the resistance comprises at least one of an internal resistance of a resistance region that is connected to ground and is formed so as to be electrically isolated from the first guard ring and an internal resistance of the first guard ring.

7. The semiconductor device according to claim 5, wherein the capacitance is connected to the gate region and the gate region is connected to the resistance.

* * * * *